(12) United States Patent
Mashino

(10) Patent No.: US 7,755,910 B2
(45) Date of Patent: Jul. 13, 2010

(54) CAPACITOR BUILT-IN INTERPOSER AND METHOD OF MANUFACTURING THE SAME AND ELECTRONIC COMPONENT DEVICE

(75) Inventor: Naohiro Mashino, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/882,646

(22) Filed: Aug. 3, 2007

(65) Prior Publication Data

US 2008/0030968 A1 Feb. 7, 2008

(30) Foreign Application Priority Data

Aug. 7, 2006 (JP) .............................. 2006-214205

(51) Int. Cl.
*H05K 1/16* (2006.01)
(52) U.S. Cl. ...................... 361/765; 361/763; 361/766; 361/738; 174/253; 174/255
(58) Field of Classification Search ................. 361/765, 361/763, 766, 738; 174/253, 255, 700
See application file for complete search history.

(56) References Cited

U.S. PATENT DOCUMENTS

| | | | |
|---|---|---|---|
| 5,177,670 A * | 1/1993 | Shinohara et al. ........... | 361/738 |
| 5,847,423 A | 12/1998 | Yamamichi | |
| 6,573,584 B1 * | 6/2003 | Nagakari et al. ............ | 257/528 |
| 6,936,774 B2 * | 8/2005 | Sugaya et al. ............... | 174/255 |
| 7,115,431 B2 * | 10/2006 | Chen .......................... | 438/30 |
| 7,223,652 B2 * | 5/2007 | Ooi et al. .................... | 438/238 |
| 7,239,014 B2 * | 7/2007 | Ogawa et al. ............... | 257/700 |
| 7,335,531 B2 * | 2/2008 | Iijima et al. ................. | 438/106 |
| 2003/0086248 A1 | 5/2003 | Mashino ...................... | 361/767 |
| 2003/0116348 A1 | 6/2003 | Nakatani et al. | |
| 2005/0185382 A1 * | 8/2005 | Ooi et al. ..................... | 361/718 |
| 2006/0001063 A1 | 1/2006 | Lee ............................. | 257/295 |

(Continued)

FOREIGN PATENT DOCUMENTS

EP 0817259 1/1998

(Continued)

OTHER PUBLICATIONS

European Search Report dated Apr. 7, 2008.

*Primary Examiner*—Tuan T Dinh
*Assistant Examiner*—Xiaoliang Chen
(74) *Attorney, Agent, or Firm*—Kratz, Quintos & Hanson, LLP

(57) ABSTRACT

A capacitor built-in interposer of the present invention, includes a base resin layer, a capacitor first electrode provided to pass through the base resin layer and having projection portions projected from both surface sides of the base resin layer respectively whereby the projection portion on one surface side of the base resin layer serves as a connection portion, a capacitor dielectric layer for covering the projection portion of the first electrode on other surface side of the base resin layer, and a capacitor second electrode for covering the dielectric layer, wherein a plurality of capacitors each constructed by the first electrode, the dielectric layer, and the second electrode are arranged and aligned in a lateral direction in a state that the capacitors are passed through the base resin layer.

5 Claims, 14 Drawing Sheets

U.S. PATENT DOCUMENTS

2006/0262481 A1* 11/2006 Mashiko .................. 361/306.2
2008/0291649 A1* 11/2008 Mashino .................... 361/763

FOREIGN PATENT DOCUMENTS

| JP | 06268141 | 9/1994 |
| JP | 07245233 | 9/1995 |
| JP | 2001-291637 | 10/2001 |
| JP | 2006-120696 | 5/2006 |

* cited by examiner

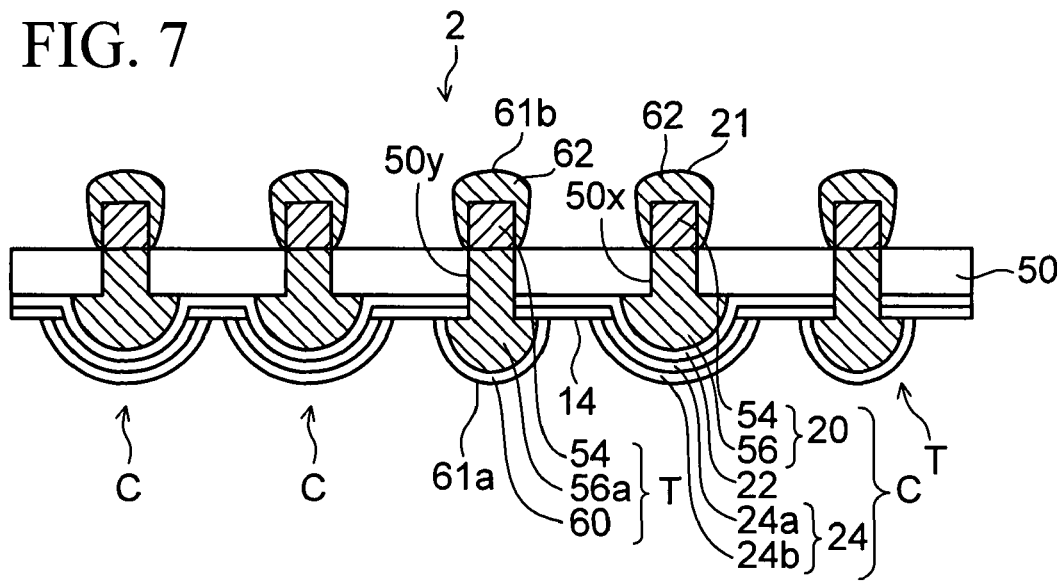
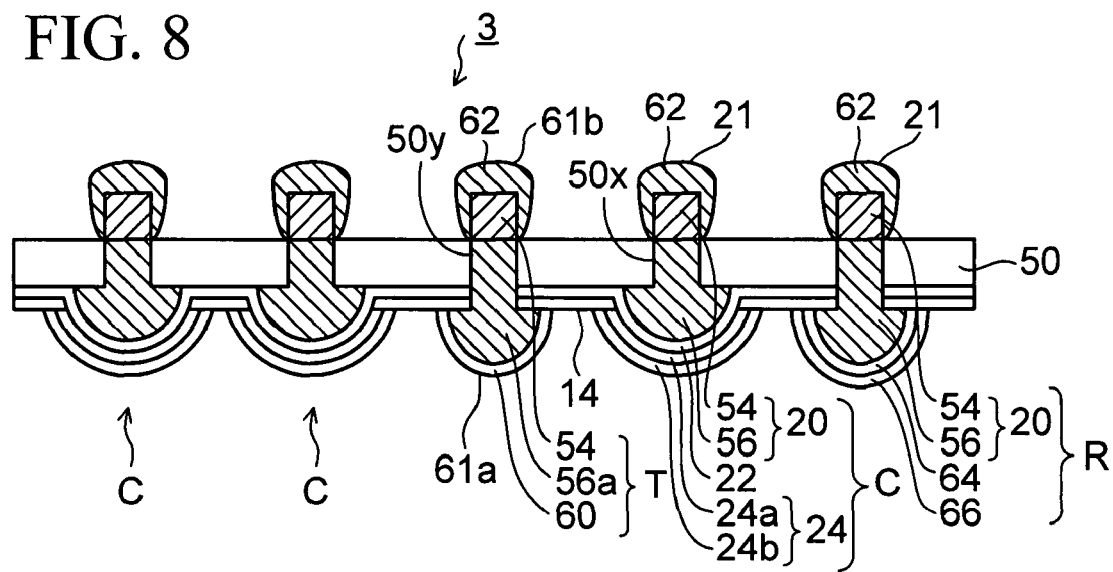

CAPACITOR BUILT-IN INTERPOSER AND METHOD OF MANUFACTURING THE SAME AND ELECTRONIC COMPONENT DEVICE

CROSS-REFERENCE TO RELATED APPLICATIONS

This application is based on and claims priority of Japanese Patent Application No. 2006-214205 filed on Aug. 7, 2006, the entire contents of which are incorporated herein by reference.

BACKGROUND OF THE INVENTION

1. Field of the Invention

The present invention relates to a capacitor built-in interposer and a method of manufacturing the same and an electronic component device and, more particularly, a capacitor built-in interposer applicable to an interposer used to connect a semiconductor chip and a wiring substrate and a method of manufacturing the same and an electronic component device utilizing the same.

2. Description of the Related Art

In the prior art, there is the electronic component device constructed by mounting the semiconductor chip on the wiring substrate in which the decoupling capacitor is built. As shown in FIG. 1, in an example of such electronic component device, first wiring layers 100 are embedded in a first interlayer insulating layer 200 in a state that their lower surfaces are exposed, and second wiring layers 120 connected to the first wiring layers 100 via first via holes VH1 provided in the first interlayer insulating layer 200 are formed on the first interlayer insulating layer 200.

Also, connection terminals 340 of a capacitor component 300 constructed by forming a first electrode 310, a dielectric substance 320, and a second electrode 330 under a supporting body 350 are connected to the second wiring layers 120. A die attaching tape 400 is arranged under the capacitor component 300. Also, a second interlayer insulating layer 220 is formed on the capacitor component 300 such that the capacitor component 300 is embedded in this second interlayer insulating layer 220.

Also, third wiring layers 140 connected to the second wiring layers 120 via second via holes VH2 formed in the second interlayer insulating layer 220 are formed on the second interlayer insulating layer 220. A solder resist 500 to the connection portions of which opening portions 500x are provided is formed on the third wiring layers 140. Also, bumps 600a of a semiconductor chip 600 are flip-chip connected to connection portions of the third wiring layers 140.

In Patent Literature 1 (Patent Application Publication (KOKAI) 2001-291637), it is set forth that the spherical capacitor constructed such that the first electrode, the dielectric substance, and the second electrode are stacked on a surface of the spherical core and electrode portions of the first electrode are exposed is provided and connected to the electric wire circuit of the wiring substrate.

In Patent Literature 2 (Patent Application Publication (KOKAI) 2006-120696), it is set forth that the capacitor being constructed by the internal electrode formed of the porous metal layer in which a plurality of bubbles are provided from an inner surface to an outer surface, the dielectric layer provided onto inner surfaces of the bubbles and an outer surface of the internal electrode, and the external electrode formed to contact the dielectric layer is inserted into the circuit substrate, and then the semiconductor chip is mounted on such circuit substrate.

In the above electronic component device shown in FIG. 1 in the prior art, the capacitor component 300 on the lower side of which the connection terminals 340 are flat-mounted on the wiring substrate. In order to connect the semiconductor chip 600 to the capacitor component 300, the connection terminals 340 of the capacitor component 300 must be lifted up to the overlying third wiring layers 140 via the second via holes VH2 after the connection terminals 340 of the capacitor component 300 are connected to the second wiring layers 120 so that the capacitor component 300 is buried with the second interlayer insulating layer 220. Therefore, wiring routes from the capacitor component 300 to the semiconductor chip 300 are relatively long.

As a result, a relatively large inductance exists between leads of the semiconductor chip 600 and the capacitor component 300 respectively. In some cases, an effect of the decoupling capacitor cannot be sufficiently achieved.

Also, in the prior art, such problems have arisen that it is difficult to change the wiring routes because positions of the connection terminals of the capacitor component are restricted, and a circuit design is restricted and a margin of design is small because the die attaching tape must be used, and others.

Further, in case the two-terminal type stacked ceramic capacitor having the connection terminals on the side surfaces is built in the wiring substrate, the leading of wirings is required similarly. As a result, the similar problems have arisen.

SUMMARY OF THE INVENTION

It is an object of the present invention to provide a capacitor built-in interposer used to construct an electronic component device in which a capacitor can be arranged in a closer position to a semiconductor chip and connected thereto and whose margin of design is large and a method of manufacturing the same and an electronic component device utilizing the same.

A capacitor built-in interposer of the present invention, includes a base resin layer, a capacitor first electrode provided to pass through the base resin layer and having projection portions projected from both surface sides of the base resin layer respectively whereby the projection portion on one surface side of the base resin layer serves as a connection portion, a capacitor dielectric layer for covering the projection portion of the first electrode on other surface side of the base resin layer, and a capacitor second electrode for covering the dielectric layer, wherein a plurality of capacitors each constructed by the first electrode, the dielectric layer, and the second electrode are arranged and aligned in a lateral direction in a state that the capacitors are passed through the base resin layer.

In the capacitor built-in interposer of the present invention, a plurality of capacitors are arranged and aligned in a lateral direction in a state that the capacitors are passed through the base resin layer. The first electrode of the capacitor is formed to pass through the base resin layer, and the first electrode has projection portions projected from both surface sides of the base resin layer respectively. The projection portion on one surface side of the base resin layer serves as the connection portion of the first electrode. Then, the capacitor is constructed by forming sequentially the dielectric layer and the second electrode on the projection portion on the other surface side of the base resin layer.

In the preferred mode of the present invention, in the capacitor built-in interposer, the through electrode constructed by the same structure as the first electrode of the capacitor is built in addition to the capacitor and the conductive paths for conducting electrically the upper and lower sides are provided. Also, the capacitor built-in interposer of the present invention is arranged between the wiring substrate and the semiconductor chip, and serves as the interposer to connect them.

In the case of this mode, the connection portion of the second electrode of the capacitor and one end side of the through electrode in the capacitor built-in interposer are connected directly to the wiring substrate, and the first electrode of the capacitor and the other end side of the through electrode are connected directly to the semiconductor chip, so that the electronic component device is constructed. The through electrode is used as the conductive path such as the signal line between the semiconductor chip and the wiring substrate, and the like.

In this manner, in the capacitor built-in interposer of the present invention, the first and second electrodes of the capacitor provided to pass through the base resin layer can be connected directly to the wiring substrate and the semiconductor chip. Therefore, unlike the prior art, there is no need to route around the wiring connected to the capacitor in the wiring substrate upon connecting the wiring to the semiconductor chip. As a result, the inductance generated between the capacitors and the semiconductor chip can be reduced, and thus the capacitor built-in interposer can perform enough performances as the decoupling capacitor for the semiconductor chip that operates at a high speed. In addition, since this capacitor built-in interposer has the through electrode serving as the conductive path, such interposer can be used equally to the common interposer.

Also, there is no need to mount the capacitor component on the wiring substrate, or to build in the capacitor into the wiring substrate. Therefore, the electronic component device can formed with a simple structure and also a margin of design of the electronic component device can be widened.

In addition, in the preferred mode of the present invention, the top end portion of the projection portion of the first electrode on the surface of the base resin layer, on which the capacitor is constructed, is shaped into the convex curved surface. Therefore, the capacitor is constructed by coating the dielectric layer and the second electrode on the convex curved surface of the first electrode. As a result, the capacitor having a large capacitance rather than the case where the capacitor is formed in a flat shape can be formed in the equal installation area.

Also, a method of manufacturing a capacitor built-in interposer of the present invention, includes the steps of preparing a base resin layer on one surface of which a plurality of metal posts are provided upright, and a metal supporting body on one surface of which a flexible metal layer is formed, pasting the metal supporting body and the base resin layer together by pushing the metal posts on the base resin layer into the flexible metal layer on the metal supporting body to embed the metal posts in the flexible metal layer, forming a first plating opening portion in a portion of the base resin layer on the predetermined metal posts, obtaining a first electrode constructed by the metal posts and a metal bump by forming the metal bump, which projects from an upper surface of the base resin layer, in the first plating opening portion by using an electroplating utilizing the metal supporting body, the flexible metal layer, and the metal posts as a plating power feeding path, forming a dielectric layer for covering the first electrode, obtaining a capacitor by forming a second electrode for covering the dielectric layer, and exposing the metal posts by removing the metal supporting body and the flexible metal layer.

In the present invention, first, the metal posts are embedded in the flexible metal layer by pushing the metal posts on the base resin layer into the flexible metal layer (tin, or the like) on the metal supporting body (copper, or the like). Then, the first plating opening portions are formed in portions of the base resin layer on predetermined portions of the metal posts, and then the metal bumps that protrude from the bottom of the first plating opening portions to the upper side of the base resin layer and are connected to the metal bumps are formed by the electroplating, so that the first electrode for the capacitor can be obtained. At this time, a top end portion of the metal bump is formed as the convex curved surface. Then, the capacitor is obtained by forming the dielectric layer to cover the first electrode, and the second electrode. Then, the metal posts serving as the connection portion of the first electrode are exposed by removing the metal supporting body and the flexible metal layer.

The capacitor built-in interposer of the present invention can be easily manufactured by using the above manufacturing method. Also, the through electrode and the resistor portion as well as the capacitors can be easily built in on the basis of forming the plating opening portions in portions on another metal posts and then forming the metal bumps after the capacitor is formed.

As explained above, according to the present invention, the electronic component device in which the capacitor can be arranged in a closer position to the semiconductor chip and can be connected thereto and whose margin of design is large can be constructed.

BRIEF DESCRIPTION OF THE DRAWINGS

FIG. 7 is a sectional view showing the capacitor built-in interposer according to the second embodiment of the present invention;

FIG. 8 is a sectional view showing a capacitor built-in interposer according to a variation of the second embodiment of the present invention;

DETAILED DESCRIPTION OF THE PREFERRED EMBODIMENTS

Embodiments of the present invention will be explained with reference to the accompanying drawings hereinafter.

First Embodiment

Figure 1:
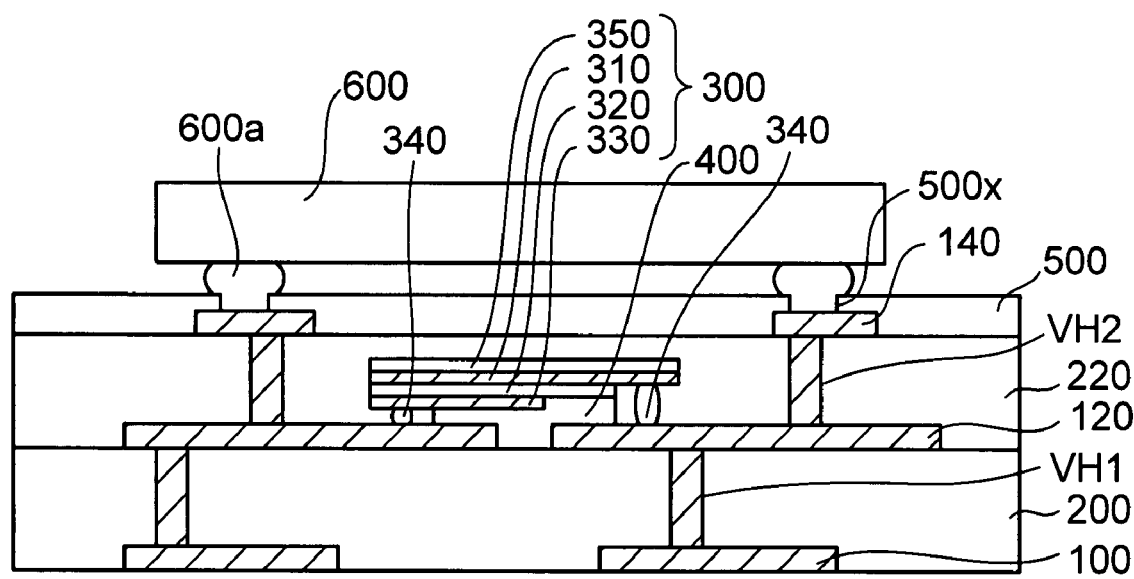
FIG. 1 is a sectional view showing an example of an electronic component device in which a capacitor is built in the prior art.
Figure 2A:
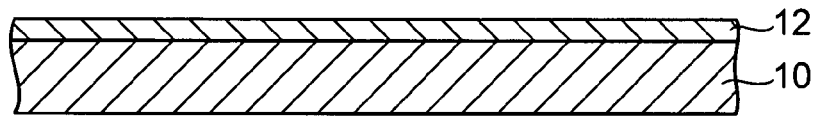
FIGS. 2A to 2K are sectional views showing a method of manufacturing a capacitor built-in interposer according to a first embodiment of the present invention.
Figure 2B:
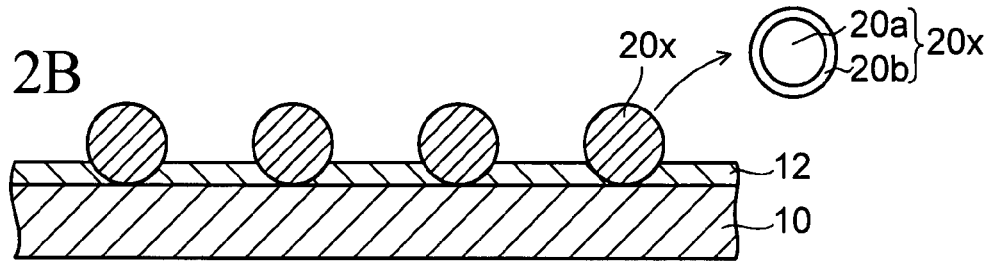
Figure 2C:
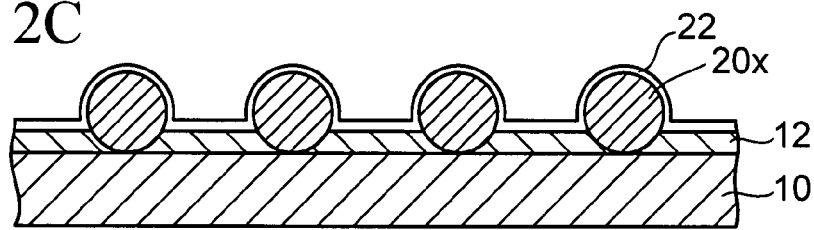
Figure 2D:
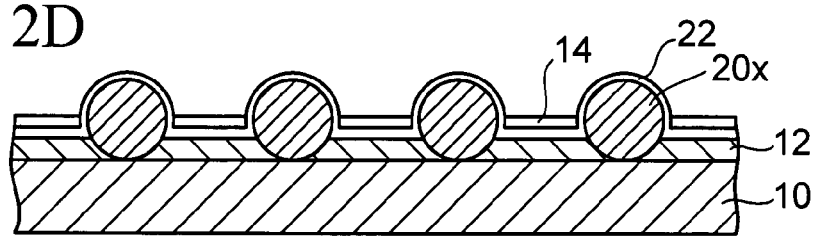
Figure 2E:
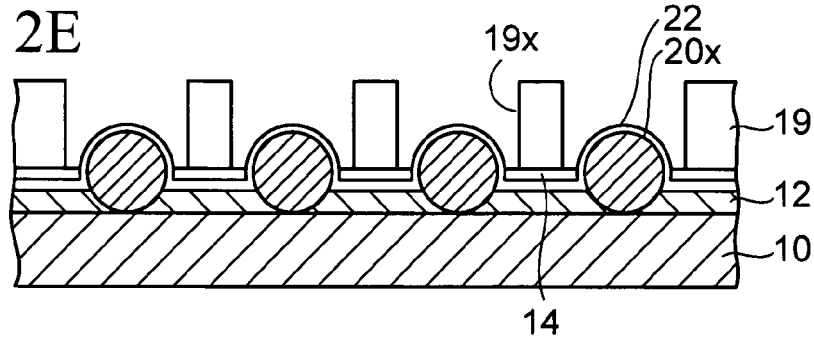
Figure 2F:
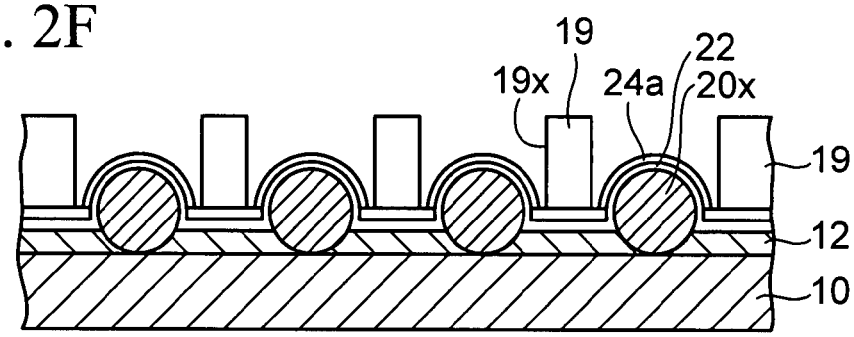
Figure 2G:
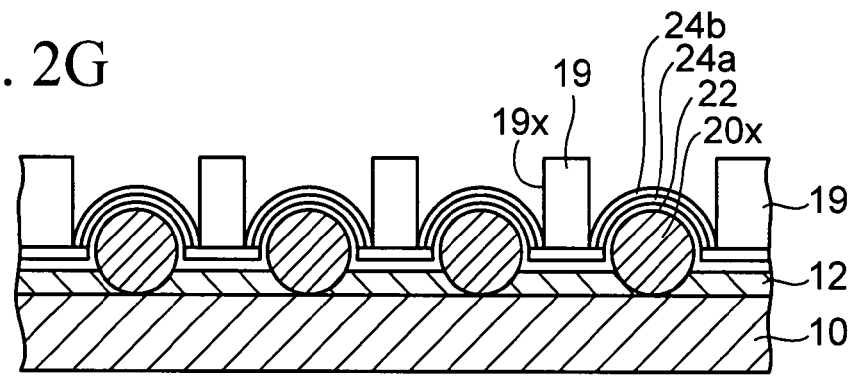
Figure 2H:
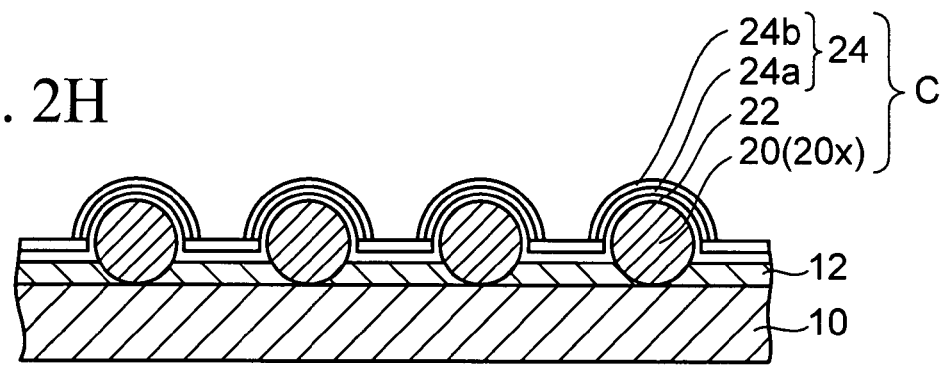
Figure 2I:
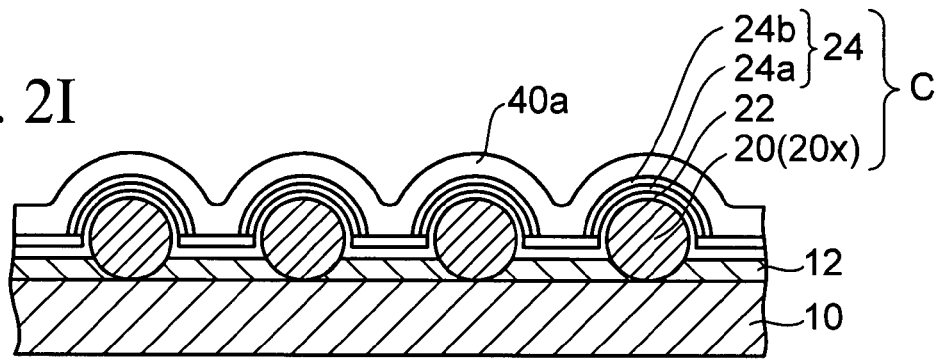
Figure 2J:
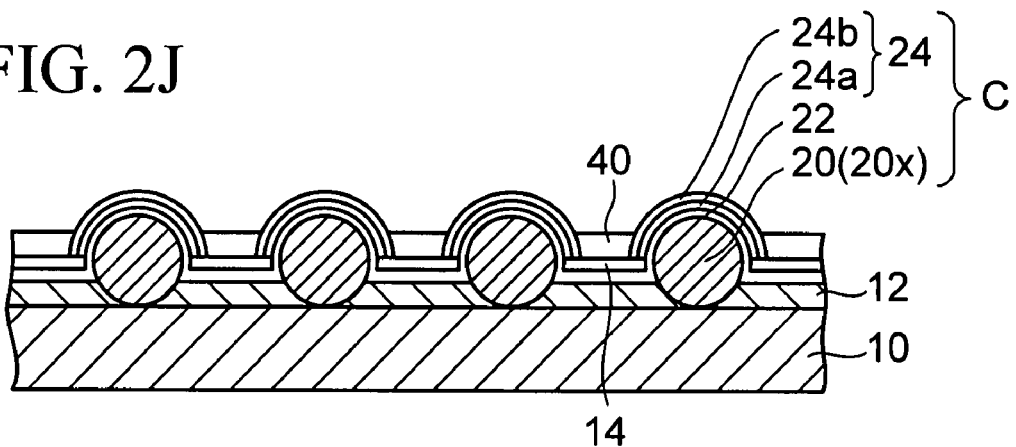
Figure 2K:
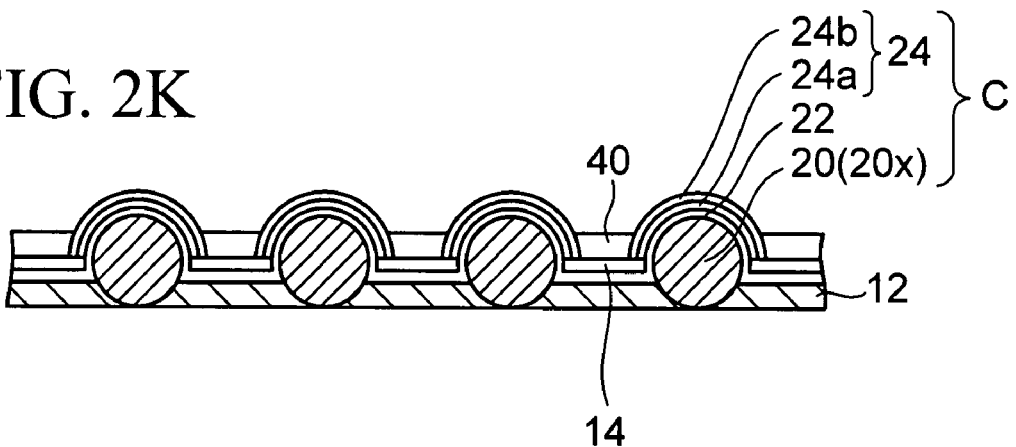
Figure 3:
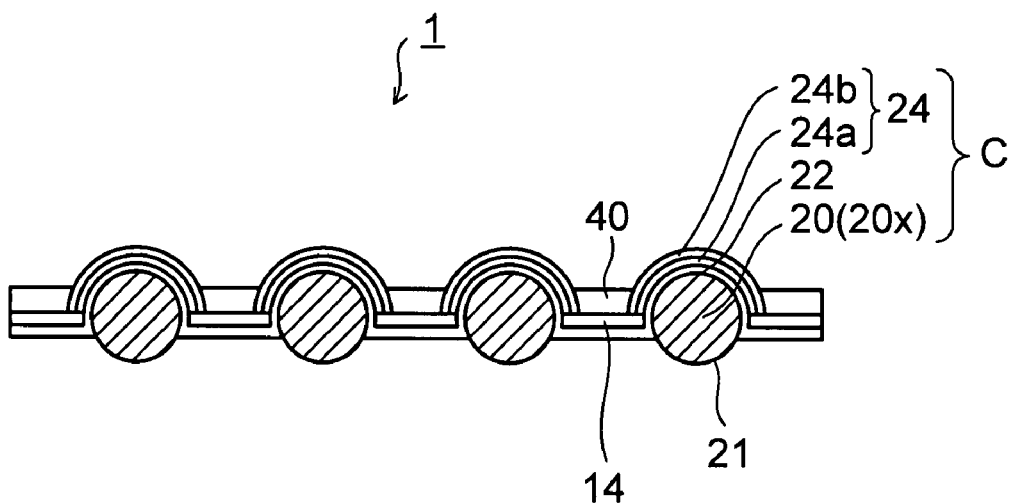
FIG. 3 is a sectional view showing the capacitor built-in interposer according to the first embodiment of the present invention.

FIGS. 2A to 2K are sectional views showing a method of manufacturing a capacitor built-in interposer according to a first embodiment of the present invention, and FIG. 3 is a sectional view showing similarly the capacitor built-in interposer.

In the method of manufacturing a capacitor built-in interposer according to the present embodiment, as shown in FIG. 2A, first, a copper plate 10 as a metal supporting body is prepared, and a tin layer 12 acting as a flexible metal layer is formed by plating a tin on the copper plate 10. A thickness of the copper plate 10 is 0.3 to 0.4 mm, and a film thickness of the tin layer 12 is almost 60 μm.

Then, as shown in FIG. 2B, spherical conductors 20x a diameter of each of which is about 5 to 200 μm are prepared. The spherical conductor 20x is constructed by covering an outer surface of a copper ball 20a with a gold layer 20b. As the spherical conductor 20x, a ball constructed by covering an outer surface of each of various metal balls formed of 42 alloy, and the like with a conductor layer such as a gold layer, or the like may be used in addition to the copper ball 20a. Alternately, a ball constructed by covering an outer surface of an insulating ball formed of plastic, glass, ceramic, or the like with a conductor layer may be used. In short, various balls may be used if a conductor layer is coated on an outer surface of the ball.

Then, as also shown in FIG. 2B, a plurality of spherical conductors 20x are arranged and fixed to a carrying plate (not shown) that sucks the spherical conductors 20x and carries them. Then, a plurality of spherical conductors 20x sucked by the carrying plate are pushed against the tin layer 12 in a state that they are opposed to the tin layer 12 on the copper plate 10, and then the carrying plate is removed from the spherical conductors 20x. Thus, one end sides of a plurality of spherical conductors 20x are partially embedded in the tin layer 12.

More particularly, a plurality of spherical conductors 20x are arranged on the copper plate 10 in a lattice area array type in a state that one end sides of these spherical conductors 20x are partially embedded in the tin layer 12. Since the tin layer 12 is formed of a flexible metal and has a high extensibility, these spherical conductors 20x can be easily pushed into the tin layer 12 and arranged thereon. As described later, the spherical conductors 20x function as first electrodes for the capacitor.

Then, as shown in FIG. 2C, a dielectric layer 22 is formed on the spherical conductors 20x and the tin layer 12 to cover exposed spherical surfaces of the spherical conductors 20x. As the dielectric layer 22, a metal oxide layer made of BST ((Ba, Sr)TiO$_3$), STO (SrTiO$_3$), PZT (Pb(Zr,Ti)O$_3$), BTO (BaTiO$_3$), AlOx (alumina), SiOx (silicon oxide), SiN (silicon nitride), NbOx (niobium oxide), TiOx (titanium oxide), or the like or a resin containing fillers of these metal oxides may be employed. These dielectric layers are formed by the sputter method, the MOCVD (metal organic CVD) method, or the like.

Then, as shown in FIG. 2D, a resist is patterned in areas between a plurality of spherical conductors 20x by the photolithography, and resultant layers are cured. Thus, intermediate resin layers 14 are formed.

Then, as shown in FIG. 2E, a dry film resist 19 having opening portions 19x to expose respective spherical conductors 20x is formed on the intermediate resin layers 14 by the photolithography. Then, as shown in FIG. 2F, gold layers 24a each coating the dielectric layer 22 on the spherical conductors 20x are formed by sputtering a gold on the upper surface side of the structural body in FIG. 2E. Then, as shown in FIG. 2G, solder layers 24b each coating the gold layer 24a on the spherical conductors 20x by the screen printing method, or the like. Then, the dry film resist 19 is removed by the wet process. At this time, the gold layer formed on the dry film resist 19 is removed together with the dry film resist 19 by the lift-off method.

In this case, the gold layer 24a and the solder layer 24b can be formed selectively on the dielectric layer 22 on the spherical conductors 20x by the pulse electroplating utilizing the copper plate 10, the tin layer 12, and the spherical conductors 20x as the plating power feeding path.

Thus, as shown in FIG. 2H, the spherical conductors 20x act as a first electrode 20 respectively. Thus, capacitors C each constructed by the first electrode 20, the dielectric layer 22, and a second electrode 24 composed of the gold layer 24a and the solder layer 24b are obtained.

Then, as shown in FIG. 2I, a resin coating layer 40a is formed by coating a photosensitive resin such as polyimide, epoxy, or the like on the structural body in FIG. 2H. Then, this resin coating layer 40a is exposed via a photomask. For example, when a negative photosensitive resin is used, portions of the resin coating layer 40a between the capacitors C are exposed and then developed, so that the resin coating layer 40a is left in regions between the capacitors C.

Then, as shown in FIG. 2J, a base resin layer 40 for integrating a plurality of capacitors C into a sheet is obtained by curing the resin coating layer 40a by means of a heat treatment. Otherwise, a polyimide film, or the like may be pasted such that the upper surface becomes flat, and then the base resin layer 40 may be left by etching this film by a plasma etching until the second electrodes 24 are exposed.

Then, as shown in FIG. 2K, the tin layer 12 is exposed by removing the copper plate 10 by the etching using an ammonia-based alkaline etchant. Then, the exposed tin layer 12 is removed selectively with respect to the first electrode 20 (the spherical conductor 20x) and the dielectric layer 22 by a nitric acid-based etchant. In this case, when a plurality of interposers are obtained from one substrate, the substrate is cut at a predetermined timing.

Accordingly, as shown in FIG. 3, the capacitor built-in interposer 1 according to the first embodiment can be obtained. In the capacitor built-in interposer 1 according to the first embodiment, a plurality of spherical capacitors C being arranged in an area array type are supported by the base resin layer 40 and integrated like one sheet. That is, a plurality of spherical capacitors C are coupled mutually via the base resin layer 40 to constitute one sheet-like interposer.

The capacitor C is constructed by the first electrode 20 formed of the spherical conductor 20x, the dielectric layer 22, and the second electrode 24 (the gold layer 24a and the solder layer 24b). The first electrode 20 is provided to pass through the base resin layer 40 such that its spherical surface (convex curved surface) protrudes from both surface sides of the base resin layer 40. In the first embodiment, the spherical portion protruding from both surface sides of the base resin layer 40 is formed as the protruded portion. The dielectric layer 22 is coated on the spherical surface of the first electrode 20 protruding from the upper surface of the base resin layer 40, and the second electrode 24 is formed to be coated on the dielectric layer 22. Also, the spherical surface protruding from the lower surface of the base resin layer 40 constitutes a connection portion 21 of the first electrode 20.

Also, the intermediate resin layer 14 is formed in the areas between the capacitors C respectively. Even though a structure in which the dielectric layer 22 is not present between the capacitors C is employed, an electric short circuit between the first electrode 20 and the second electrode 24 can be prevented.

Figure 4:
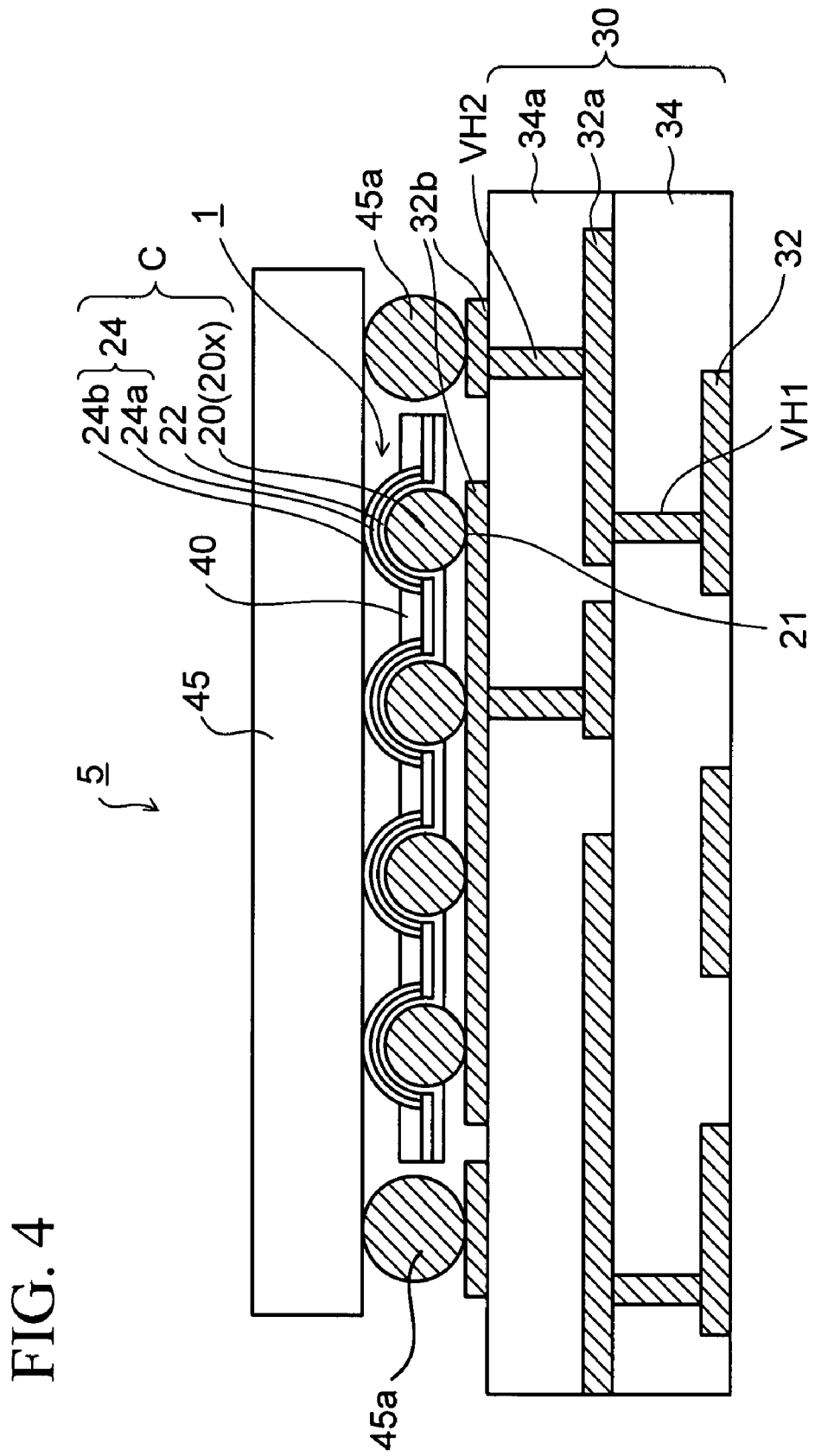
FIG. 4 is a sectional view (#1) showing an electronic component device utilizing the capacitor built-in interposer according to the first embodiment of the present invention.

An example of the electronic component device constructed by connecting the wiring substrate and the semiconductor chip via the capacitor built-in interposer according to the present embodiment is shown in FIG. 4. An electronic component device 5 is constructed by connecting a semiconductor chip 45 to a wiring substrate 30 via the capacitor built-in interposer 1 according to the present embodiment. In the wiring substrate 30, first wiring layers 32 are embedded in a first interlayer insulating layer 34 in a state that their lower surfaces are exposed, and second wiring layers 32a connected to the first wiring layers 32 via first via holes VH1 provided in the first interlayer insulating layer 34 are formed on the first interlayer insulating layer 34. Also, third wiring layers 32b are formed on the second wiring layers 32a via a second interlayer insulating layer 34a, and the third wiring layers 32b are connected to the second wiring layers 32a via second via holes VH2 provided in the second interlayer insulating layer 34a.

Also, the capacitor built-in interposer 1 according to the present embodiment is arranged on the wiring substrate 30. The connection portions 21 of the first electrodes 20 (the spherical conductors 20x) of respective capacitors C of the capacitor built-in interposer 1 are connected collectively to a common electrode portion for the capacitor of the third wiring layers 32b of the wiring substrate 30. Also, the semiconductor chip 45 such as MPU, or the like is mounted on the capacitor built-in interposer 1. The second electrodes 24 of respective capacitors C of the capacitor built-in interposer 1 are connected collectively to a common electrode portion (not shown) for the capacitor of the semiconductor chip 45.

In this manner, the capacitor built-in interposer 1 is arranged between the wiring substrate 30 and the semiconductor chip 45, and a plurality of capacitors C are connected electrically in parallel and act as the decoupling capacitor. Also, signal lines, and the like of the semiconductor chip 45 are connected to the third wiring layers 32b of the wiring substrate 30 via bumps 45a arranged separately.

In the capacitor built-in interposer 1 according to the present embodiment, the connection portions 21 of the first electrodes 20 formed of the spherical conductors 20x of a plurality of capacitors C are connected directly to the common electrode portion of the third wiring layers 32b of the wiring substrate 30. Also, the second electrodes 24 on the opposite side to the connection portions 21 of the first electrodes 20 are connected directly to the common electrode portion of the semiconductor chip 45.

With this arrangement, unlike the prior art, there is no need to route around the wiring in the wiring substrate 30 upon connecting the capacitors C and the semiconductor chip 45. Therefore, the electrical routes between the capacitors C and the semiconductor chip 45 can be reduced shortest. As a result, the inductance generated between the capacitors C and the semiconductor chip 45 can be reduced. Therefore, the capacitor built-in interposer 1 according to the present embodiment can perform enough performances as the decoupling capacitor for the semiconductor chip that operates at a high speed.

Also, the capacitor C is constructed by coating the dielectric layer 22 and the second electrode 24 on the spherical surface of the first electrode 20 formed of the spherical conductor 20x. Therefore, the capacitor having a large capacitance rather than the case where the capacitor is formed in a flat shape can be formed in the equal installation area.

Figure 5:
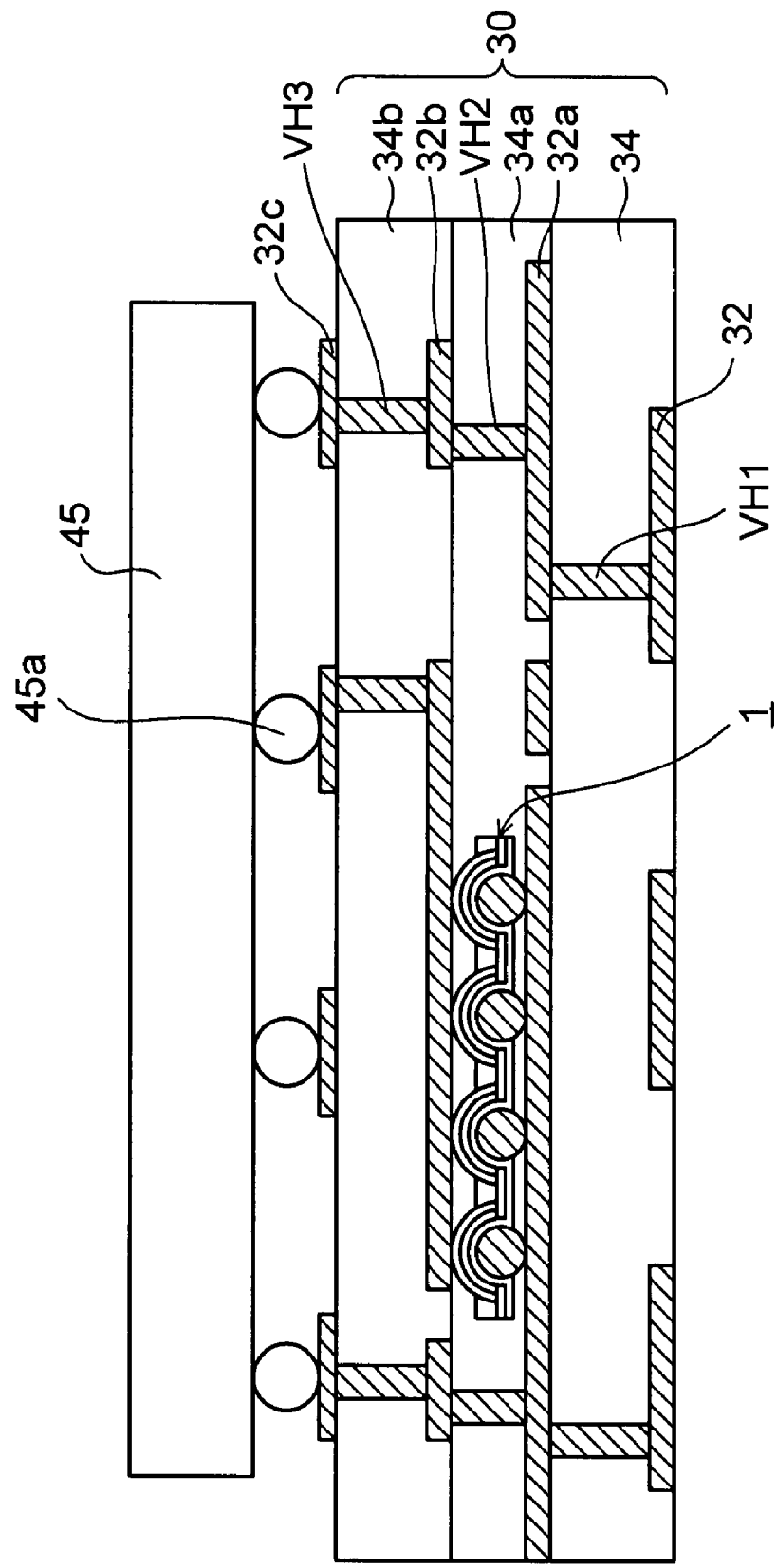
FIG. 5 is a sectional view (#2) showing an electronic component device utilizing the capacitor built-in interposer according to the first embodiment of the present invention.

An example of the electronic component device constructed by building the capacitor built-in interposer according to the present embodiment as a capacitor component in the wiring substrate on which the semiconductor chip is mounted is shown in FIG. 5. As shown in FIG. 5, the wiring substrate 30 of an electronic component device 6 is constructed by four layers of a build-up wiring (the first to fourth wiring layers 32 to 32c, the first to third interlayer insulating layers 34 to 34b) connected mutually via the first to third via holes VH1 to VH3, and the capacitor built-in interposer 1 according to the present embodiment is embedded in the second interlayer insulating layer 34a of the wiring substrate 30.

The connection portions 21 of the first electrodes 20 formed of the spherical conductors 20x of respective capacitors C of the capacitor built-in interposer 1 are connected collectively to a common electrode portion of the second wiring layers 32a, and also the second electrodes 24 are connected collectively to a lower surface of a common electrode portion of the third wiring layers 32b (respective reference symbols of the capacitor C are given in FIG. 3). Also, the bumps 45a of the semiconductor chip 45 are mounted to be connected to the fourth wiring layers 32c of the wiring substrate 30. In this manner, the capacitor built-in interposer 1 according to the present embodiment can also be used as the capacitor component. Also, the capacitor built-in interposer 1 may be embedded in a predetermined interlayer insulating layer to constitute the decoupling capacitor.

Second Embodiment

Figure 6A:
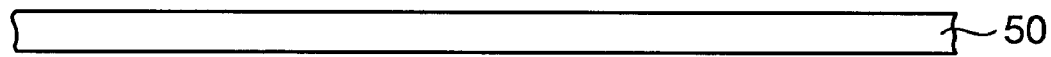
FIGS. 6A to 6O are sectional views showing a method of manufacturing a capacitor built-in interposer according to a second embodiment of the present invention.
Figure 6B:
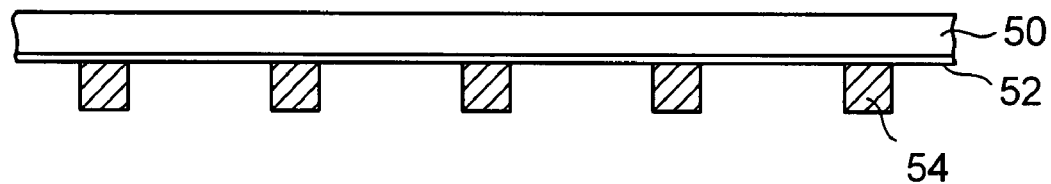
Figure 6C:
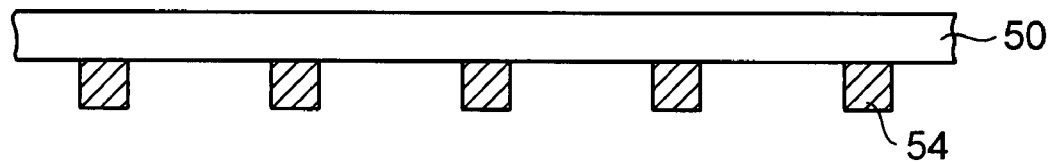
Figure 6D:
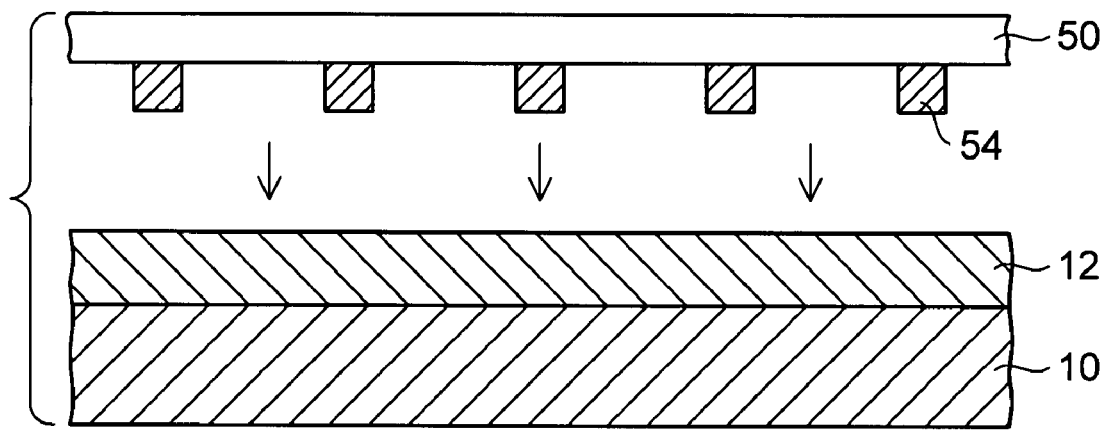
Figure 6E:
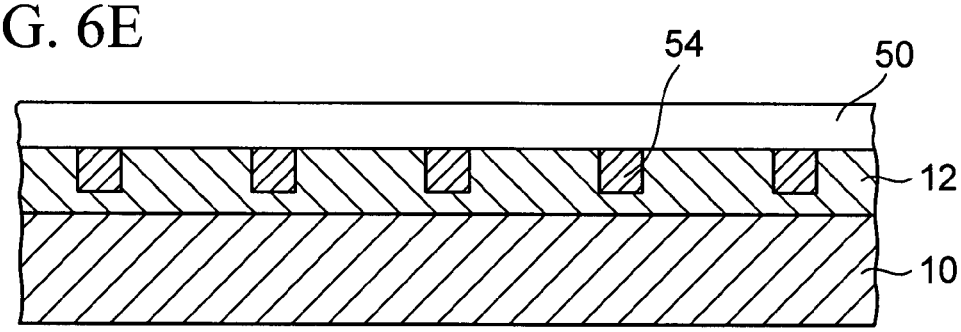
Figure 6F:
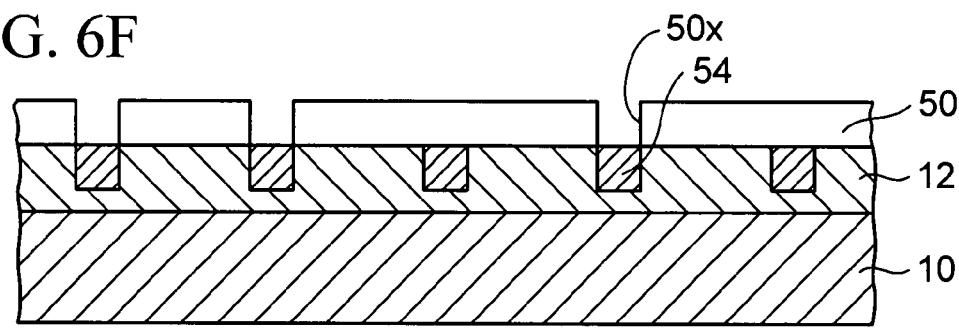
Figure 6G:
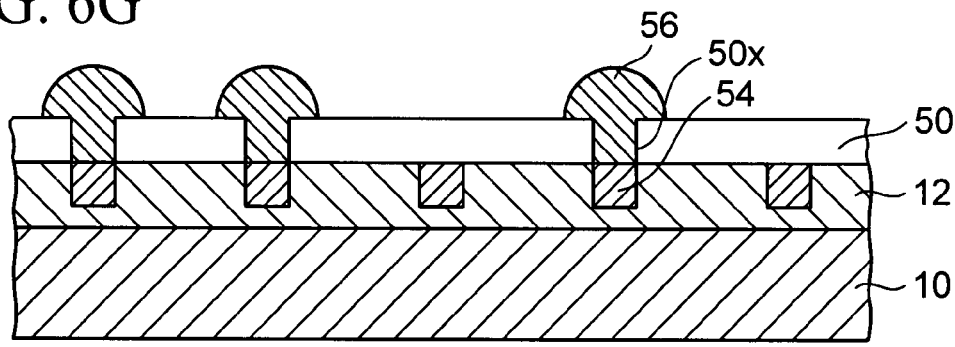
Figure 6H:
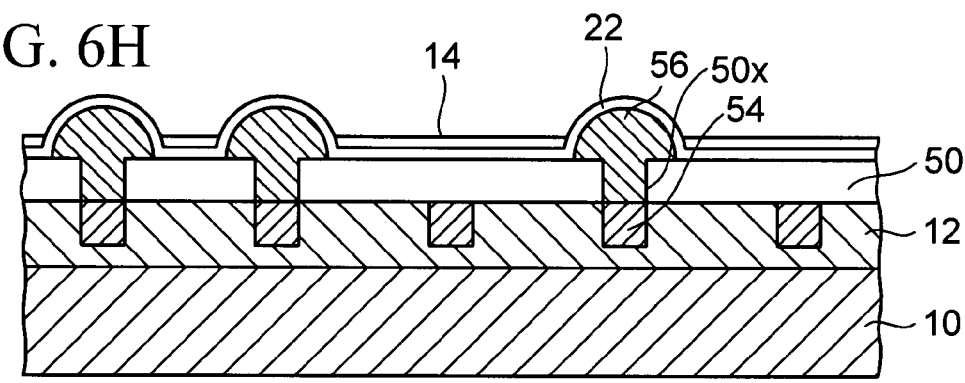
Figure 6I:
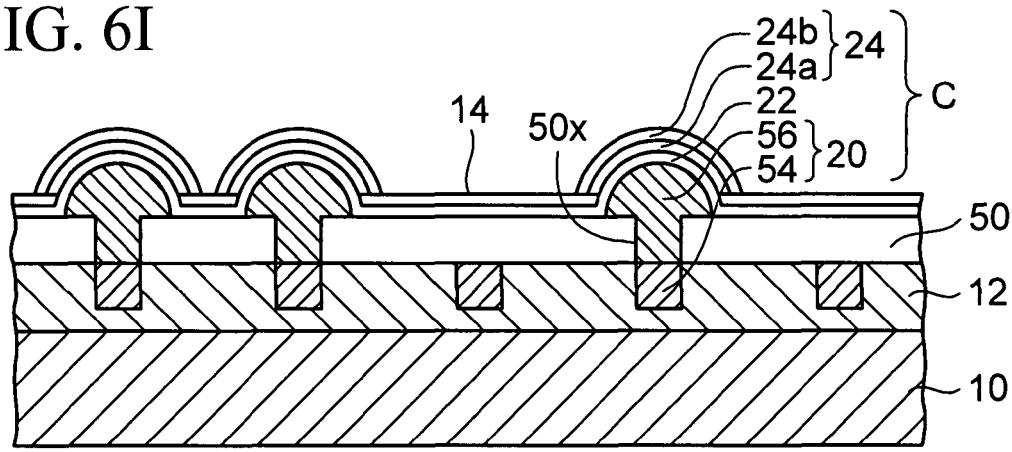
Figure 6J:
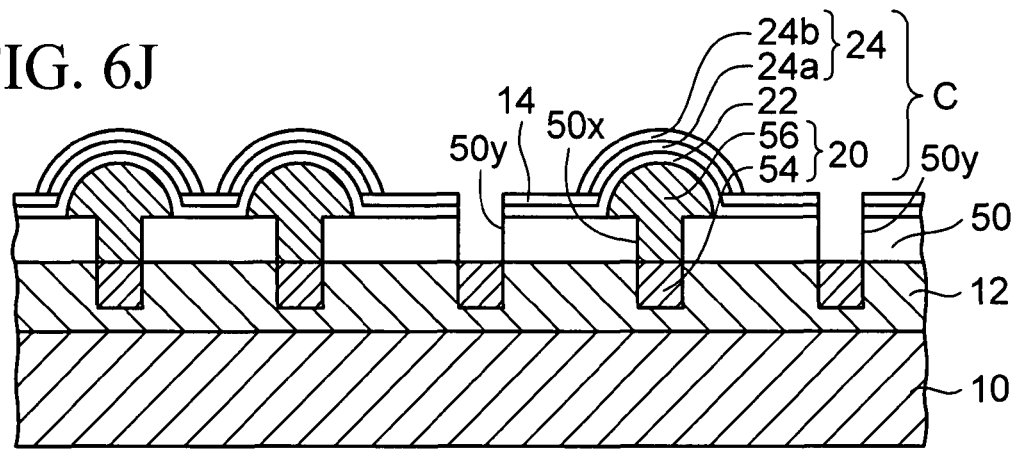
Figure 6K:
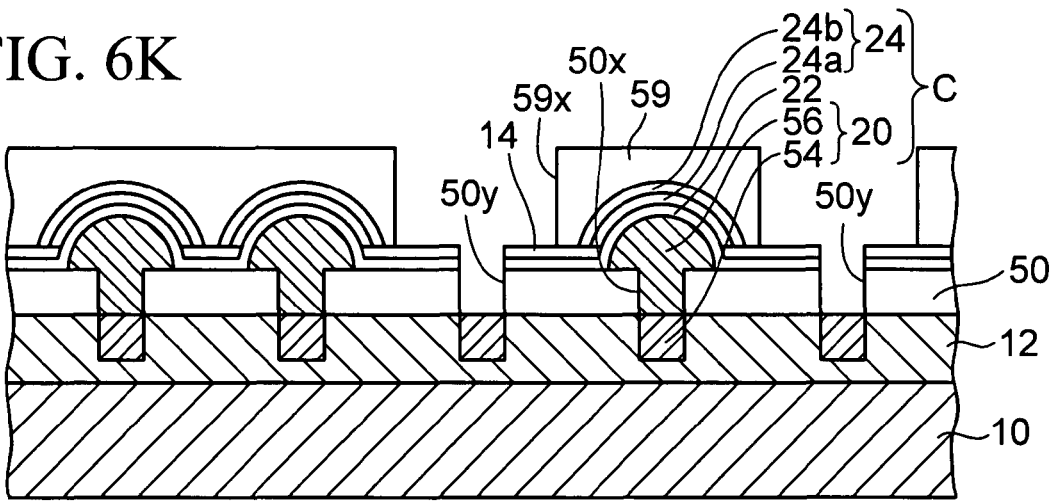
Figure 6L:
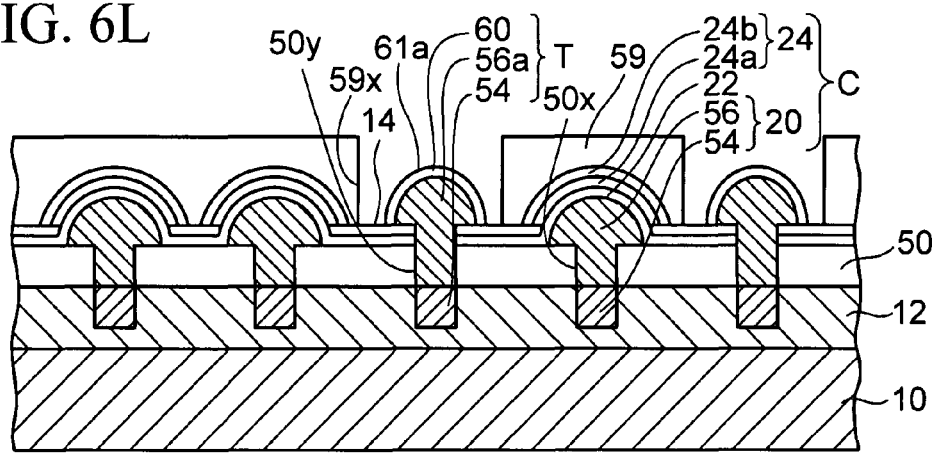
Figure 6M:
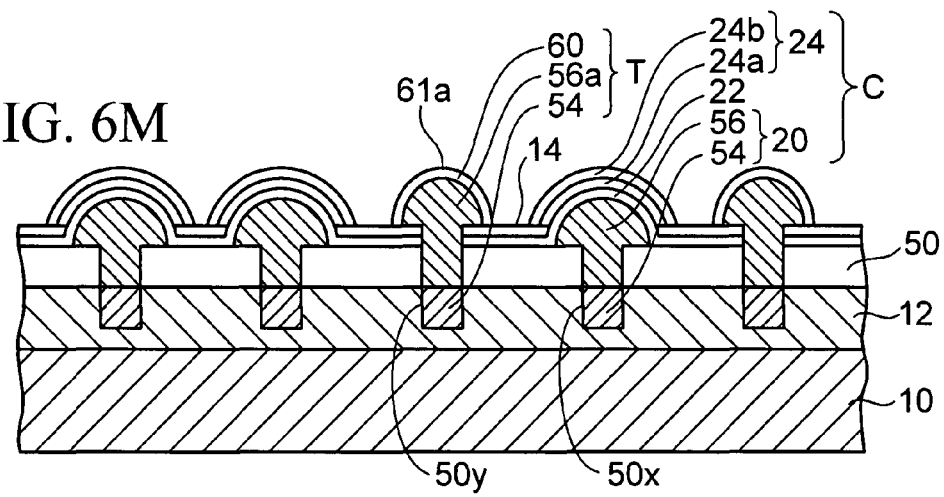
Figure 6N:
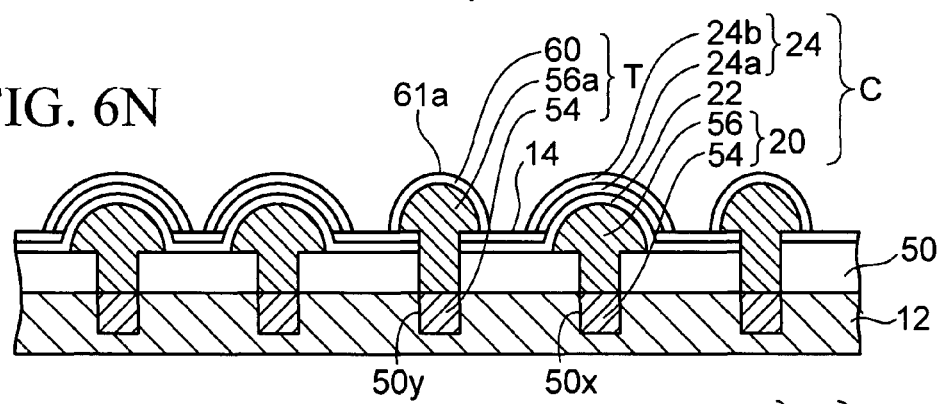
Figure 6O:
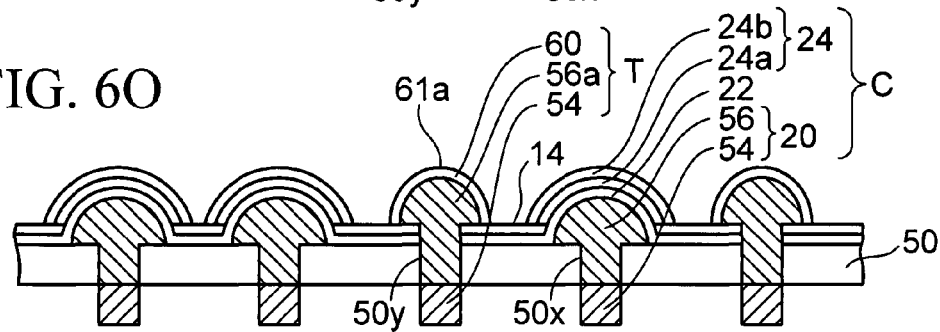

FIGS. 6A to 6O are sectional views showing a method of manufacturing a capacitor built-in interposer according to a second embodiment of the present invention, and FIG. 7 is a sectional view showing the capacitor built-in interposer similarly. In the foregoing first embodiment, spherical capacitors C are formed from all spherical conductor 20x on the basis of arranging a plurality of spherical conductors 20x on the tin layer 12 formed on the copper plate 10 with area array type. Normally, the semiconductor chip 45 is equipped with signal lines, etc. Therefore, in the first embodiment, the conductive paths such as the signal lines, and the like of the semiconductor chip 45 are ensured by providing the bumps 45a separately between the semiconductor chip 45 and the wiring substrate 30.

A feature of the second embodiment resides in that through electrodes serving as conductive paths such as the signal lines, or the like and resistor portions in addition to the capacitors are also built in the capacitor built-in interposer.

In the method of manufacturing the capacitor built-in interposer according to the second embodiment, as shown in FIG. 6A, first, a base resin layer 50 made of a high-supple elastic body such as a polyimide film, an aramid film, or the like and having a film thickness of about 50 μm is prepared. This base resin layer 50 acts finally as an elastic substrate to support a plurality capacitors, and the like. Then, as shown in FIG. 6B, a seed layer 52 made of a copper, or the like is formed on the base resin layer 50 (under the base resin layer 50 in FIG. 6B) by the sputtering.

Then, a resist film (Not shown) in which opening portions are opened in positions where copper posts are formed is formed, and a copper layer is formed in the opening portions of the resist film by the electroplating utilizing the seed layer 52 as the plating power feeding path. Then, the resist film is removed. Thus, copper posts 54 (metal posts) are formed on the seed layer 52 (under the seed layer 52 in FIG. 6B) on the base resin layer 50. Then, as shown in FIG. 6C, respective copper posts 54 are separated electrically by etching the seed layer 52 while using the copper posts 54 as a mask. For example, a height of the copper post 54 is about 20 μm, and an arrangement interval of the copper posts 54 is about 120 μm. In this case, a gold layer may be formed on surfaces of the copper posts 54 by the electroless plating, or the like.

Then, as shown in FIG. 6D, the copper plate 10 on one surface of which the tin layer 12 acting as the flexible metal layer like the first embodiment is formed is prepared. The copper posts 54 of the structural body in FIG. 6C are pushed into the tin layer 12 on the copper plate 10 oppositely, thereby both sheets are pasted together.

Thus, as shown in FIG. 6E, the copper posts 54 on the base resin layer 50 are embedded in the tin layer 12 on the copper plate 10.

In the second embodiment, the capacitors, the through electrodes utilized in the signal lines, or the like and the resistor portions are built in the interposer. Therefore, forming areas of the capacitors, the through electrode, and the resistor portions are defined on a plurality of copper posts 54 respectively.

Then, as shown in FIG. 6F, portions of the base resin layer 50 on a plurality of copper posts 54, in which the capacitors are to be formed, are processed by the laser, or the photolithography and the plasma etching. Thus, first plating opening portions 50x are formed. Then, as shown in FIG. 6G, the copper plating is applied from bottom portions of the first plating opening portions 50x upward by the electroplating using the copper plate 10, the tin layer 12, and the copper posts 54 as the plating power feeding path. Thus, first copper bumps 56 (metal bumps (projected portions)) filled in the first plating opening portions 50x to project from the upper surface of the base resin layer 50 are formed.

A top end portion of the first copper bump 56 is formed like a convex curved surface (hemispherical surface, or the like), and a height of the first copper bump 56 from the upper surface of the base resin layer 50 is set to about 30 μm, for example. A plurality of first copper bumps 56 formed by this step are connected to the copper posts 54 to constitute the first electrodes of the capacitors. A plurality of first copper bumps 56 are formed on predetermined copper posts 54 in a zigzag arrangement with respect to the copper posts 54 being arranged in an area array type.

Then, as shown in FIG. 6H, the dielectric layer 22 is formed on the base resin layer 50 and the first copper bumps 56 such that the convex curved surfaces of the first copper bumps 56 are covered with the dielectric layer 22. As the dielectric layer 22, various dielectric material explained in the first embodiment can be used. Then, as also shown in FIG. 6H, like the first embodiment, the intermediate resin layers 14 are formed by leaving the resists in the areas between the first copper bumps 56 by the patterning and then curing them.

Then, as shown in FIG. 6I, the second electrodes 24 are formed by forming sequentially the gold layer 24a and the solder layer 24b on the dielectric layer 22 on the first copper bumps 56 by the electroplating. At this time, since the dielectric layer 22 interposes between the plating power feeding paths of the electroplating, the pulse electroplating that is not affected by the presence of the dielectric layer 22 can be employed. Accordingly, the capacitors C each constructed basically by the first electrode 20 composed of the copper post 54, and the first copper bump 56, the dielectric layer 22, and the second electrode 24 composed of the gold layer 24a and the solder layer 24b are formed on the copper plate 10.

Then, as shown in FIG. 6J, second plating opening portions 50y are formed by processing respective portions of the base resin layer 50, the dielectric layer 22, and the intermediate resin layer 14, in which the through electrode utilized as the signal line, and the like is formed, between a plurality of copper posts 54. Then, as shown in FIG. 6K, a dry film resist 59 in which opening portions 59x are formed in the areas corresponding to the second plating opening portions 50y and their peripheral areas is formed.

Then, as shown in FIG. 6L, the copper plating is applied from the bottom portions of the second plating opening portions 50y upward by the electroplating utilizing the copper plate 10, the tin layer 12, and the copper posts 54 as the plating power feeding path. Thus, second copper bumps 56a filled in the second plating opening portions 50y to project from the upper surface of the base resin layer 50 are obtained. A top end portion of the second copper bump 56a is formed as the convex curved surface. At this time, since the capacitors C are covered with the dry film resist 59, the copper plating can be applied selectively only to the second plating opening portions 50y.

Then, as also shown in FIG. 6L, a contact layer 60 is formed by forming sequentially the gold layer and the solder layer on the second copper bumps 56a by the electroplating respectively, and their top end portions are used as a first connection portion 61a respectively. Accordingly, through electrodes T each constructed basically by the copper post 54 and the second copper bump 56a and the contact layer 60 being connected to the copper post 54 are formed on the copper plate 10. Then, as shown in FIG. 6M, the dry film resist 59 is removed.

In this manner, the capacitors C and the through electrodes T can be formed on the basis of forming the plating opening portions on predetermined copper posts 54 out of a plurality of copper posts 54 and then forming the copper bumps 56, 56a. Further, as described later in a variation, the resistor portions can be formed by forming the plating opening portions on another copper posts 54.

Then, as shown in FIG. 6N, the copper plate 10 is removed selectively from the tin layer 12 by etching the copper plate 10 of the structural body in FIG. 6M by using an ammonia-based alkaline etchant. Then, as shown in FIG. 6O, the tin layer 12 is removed selectively from the copper posts 54 and the base resin layer 50 by etching the exposed tin layer 12 by using a nitric acid-based etchant. Accordingly, the base resin layer 50 and the copper posts 54 are exposed from the lower surface side.

Then, as shown in FIG. 7, the structural body in FIG. 6O is turned upside down, the flux is coated on respective copper posts 54 of the capacitors C and the through electrodes T, the solder are attached selectively to the copper posts 54 by the powder coating, and solder layers 62 each covering the copper post 54 are formed by the reflow heating. The solder layers 62 can be adhered stably onto the copper posts 54 by the powder coating if the gold layer is formed on the surfaces of the copper posts 54.

Accordingly, in the capacitors C, the copper posts 54 are covered with the solder layer 62 respectively and their top end portions act as the connection portions 21 of the first electrodes 20. Also, in the through electrodes T, the copper posts 54 are covered with the solder layer 62 respectively and their top end portions act as second connection portions 61b. In this case, when a plurality of interposers are obtained from one substrate, the substrate is cut at a predetermined timing.

With the above, a capacitor built-in interposer 2 of the second embodiment can be obtained.

As shown in FIG. 7, the capacitor built-in interposer 2 of the second embodiment is constructed such that a plurality of capacitors C and the through electrodes T are aligned in the lateral direction in a state that they are passed through the base resin layer 50. That is, the sheet-like interposer in which a plurality of capacitors C and the through electrodes T are coupled integrally via the base resin layer 50 is provided.

The capacitor is constructed basically by the first electrode 20 composed of the copper post 54 and the first copper bump 56, the dielectric layer 22, and the second electrode composed of the gold layer 24a and the solder layer 24b. The copper post 54 (projected portion) constituting the first electrode 20 is formed to project from the upper surface of the base resin layer 50, and its top end portion acts as the connection portion 21 of the first electrode 20 by coating the solder layer 62 on the projected portion.

Also, the first copper bump 56 (projected portion) connected to the copper post 54 is formed to pass through the base resin layer 50 and project from the lower surface of the base resin layer 50, and its top end portion constitutes a convex curved surface (hemispherical surface, or the like). In this way, the first electrode 20 of the capacitor C is constructed by the connection portion 21 being projected from the upper surface of the base resin layer 50, and the first copper bump 56 being connected to the connection portion 21 and projected from the lower surface of the base resin layer 50, the top end portion of which constitutes a convex curved surface. Also, the dielectric layers 22 for covering the convex curved surface of the first electrode 20 respectively are formed, and the second electrodes 24 each consisting of the gold layer 24a and the solder layer 24b for covering the dielectric layer 22 are formed.

Also, the through electrodes T as well as the capacitors C are provided to the base resin layer 50. The through electrode T is constructed basically by the copper post 54 projected from the upper surface of the base resin layer 50, and the second copper bump 56a being connected to the copper post 54 and passed through the base resin layer 50 to project from the lower surface of the base resin layer 50, the top end portion of which constitutes a convex curved surface. The second copper bump 56a is covered with the contact layer 60 consisting of the gold layer and the solder layer, and its top end portion constitutes the first connection portion 61a. Also, the copper post 54 is covered with the solder layer 60, and its top end portion constitutes the second connection portion 61b.

In the capacitor built-in interposer 2 of the second embodiment, not only the capacitors C but also the through electrodes T serving as the conductive path such as the signal line, and the like can be built in. Therefore, unlike the first embodiment, the semiconductor chip and the wiring substrate can be connected only by the capacitor built-in interposer 2 not to arrange the bumps for the signal lines separately. As the case may be, the through electrodes serving as the conductive path such as the power line, the signal line, and the like can be built in.

A capacitor built-in interposer 3 according to a variation of the second embodiment is shown in FIG. 8. As shown in FIG. 8, in the capacitor built-in interposer 3 according to the variation, resistor portions R as well as a plurality of capacitors C and the through electrodes T are built in. In an example in FIG. 8, the through electrode T on the right side in FIG. 7 constitutes the resistor portion R. This resistor portion R is constructed by the first electrode 20 having the same structure as the first electrode 20 of the capacitor C, an insulating layer 64 such as an alumina layer, a silicon nitride layer, or a titanium nitride layer formed on the convex curved surface of the first electrode 20, and a second electrode 66 formed on the insulating layer 64 and made of gold. Also, like the capacitor C, the copper post 54 is covered with the solder layer 62, and its top end portion acts as the connection portion 21 of the first electrode 20.

In order to form the resistor portion R in the capacitor built-in interposer 3 according to the variation, in the above step in FIG. 6L, the second copper bump 56a is formed in the portion where the resistor portion is to be formed, then the insulating layer such as alumina, or the like and the gold layer are formed sequentially by the sputtering, then the dry film resist 59 is removed, thus the resistor portion R is formed by forming partially the insulating layer and the gold layer on the copper bump 56.

Figure 9:
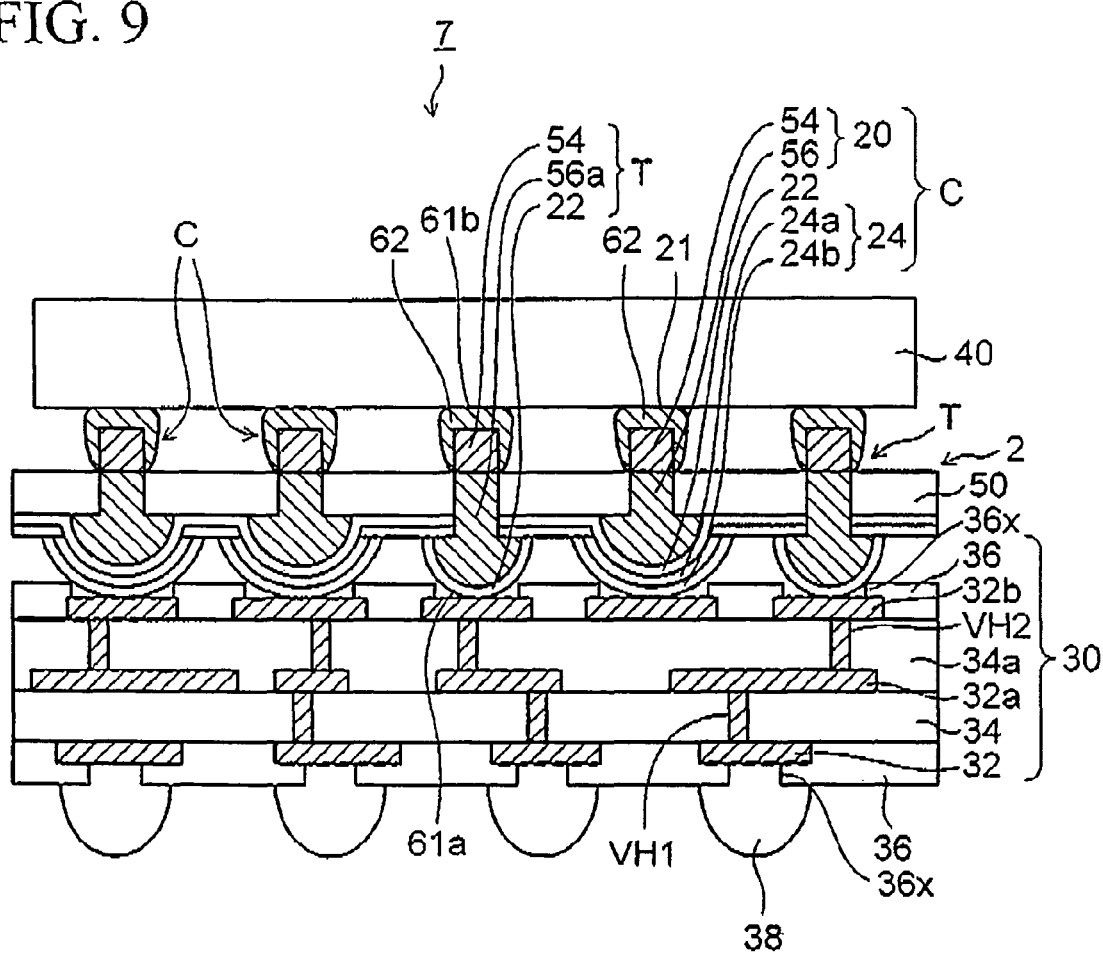
FIG. 9 is a sectional view showing an electronic component device utilizing the capacitor built-in interposer according to the second embodiment of the present invention.

Next, an example in which the capacitor built-in interposer 2 according to of the present embodiment is applied to the interposer to connect the wiring substrate and the semiconductor chip will be explained hereunder. FIG. 9 is a sectional view showing an example of the electronic component device constructed by connecting the semiconductor chip and the wiring substrate via the capacitor built-in interposer according to of the present embodiment.

As shown in FIG. 9, in the wiring substrate 30 of an electronic component device 7, the second wiring layers 32a are formed on the first wiring layers 32 via the first interlayer insulating layer 34. These second wiring layers 32a are connected to the first wiring layers 32 via the first via holes VH1 provided in the first interlayer insulating layer 34.

Also, the third wiring layers 32b are formed on the second wiring layers 32a via the second interlayer insulating layer 34a. These third wiring layers 32b are connected to the second wiring layers 32a via the second via holes VH2 provided in the second interlayer insulating layer 34a. Also, a solder resist film 36 in which opening portions 36x are provided to the portions corresponding to the connection portions of the first and third wiring layers 32, 32b is formed on both surface sides of the wiring substrate 30 respectively. In addition, external connection terminals 38 connected to the first wiring layer 32 are provided on the lower surface side of the wiring substrate 30.

Also, the capacitor built-in interposer 2 according to of the present embodiment is arranged on the wiring substrate 30. The second electrodes 24 of respective capacitors C of the capacitor built-in interposer 2 are connected to the capacitor common electrode portion of the third wiring layers 32b of the wiring substrate 30, and also the first connection portions 61a of the through electrodes T on the second copper bump 56a side are connected to the third wiring layers 32b.

In addition, the semiconductor chip 45 such as MPU, or the like is mounted on the capacitor built-in interposer 2. The connection portions 21 of the first electrodes 20 of respective capacitors C of the capacitor built-in interposer 1 are connected to the capacitor electrodes of the semiconductor chip 45, and the second connection portions 61b of the through electrodes T on the copper posts 54 side are connected to the electrodes for the signal lines, etc. of the semiconductor chip 45.

A plurality of capacitors C of the capacitor built-in interposer 2 are arranged and connected electrically in parallel between the wiring substrate 30 and the semiconductor chip 45, and function as the decoupling capacitor. Also, the electrodes such as the signal lines, and the like of the semiconductor chip 45 are connected to the third wiring layers 32b of the wiring substrate 30 via the through electrodes T.

In the capacitor built-in interposer 2 of the present embodiment, the through electrodes T serving as the conductive paths such as the signal line, and the line as well as the capacitors C are built in. Therefore, unlike the first embodiment, the wiring substrate 30 and the semiconductor chip 45 can be connected only by the capacitor built-in interposer 2. Also, when the capacitor built-in interposer 3 according to the above variation is used, the capacitors C, the through electrodes T, and the resistor portions R can be provided between the wiring substrate 30 and the semiconductor chip 45.

In the capacitor built-in interposer 2 of the second embodiment, like the first embodiment, there is no need to connect the wiring layers connected to respective capacitors C to the semiconductor chip 45 by routing around such wiring layers. Therefore, the electrical routes between the capacitors C and the semiconductor chip 45 can be reduced shortest, and the inductance can be reduced. As a result, the capacitors C can achieve sufficient performances as the decoupling capacitor for the semiconductor chip that operates at a high speed.

Also, the capacitors C are constructed by coating the dielectric layer 22 and the second electrode 24 on the first copper bumps 56 each having a convex curved surface. Therefore, the capacitor having a larger capacitance than the case where the capacitor is formed in a flat shape can be formed in the equal installation area.

Also, because the through electrodes acting as the signal lines, etc. in addition to the capacitors C and the resistor portions R are built in, the capacitor built-in interposer 2 of the second embodiment can be replaced with the conventional solder bumps (solder balls) that connect the semiconductor chip and the wiring substrate. Therefore, a need to provide the mounting areas of the capacitors and the resistor portions on the wiring substrate can be eliminated and thus the wiring substrate can be formed with a simpler structure.

In addition, in the capacitor built-in interposer 2 of the second embodiment, the copper posts 54 of the capacitor built-in interposer 2 are used as the bumps to which the semiconductor chip 45 is flip-chip connected. Since the copper posts 54 of the capacitor built-in interposer 2 of the second embodiment are formed in the opening portions in the resist by the electroplating, a height of the copper posts can be formed higher at a narrower pitch (100 μm or less) than the case where the normal solder bumps are used.

As a consequence, the capacitor built-in interposer 2 can be used as the interposer of the semiconductor chip having the electrodes at a narrow pitch. Further, since the copper posts whose height is high are provided to the base resin layer 50 serving as the high-supple elastic body, the capacitor built-in interposer 2 acts as a stress relaxing layer upon flip-chip connecting the semiconductor chip 45. As a result, reliability of the electronic component device can be improved.

Third Embodiment

FIGS. 10A to 10G are sectional views showing a method of manufacturing a capacitor built-in interposer according to a third embodiment of the present invention. A feature of the third embodiment resides in that the solder layer is utilized finally as the coating layer for the copper post on the basis of filling the solder layer in concave portions provided in the copper plate and then embedding the copper posts in the solder layers. In the third embodiment, detailed explanation of the same steps as those in the second embodiment will be omitted herein.

Figure 10A:
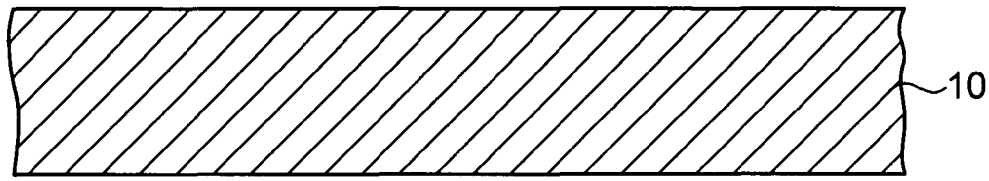
FIGS. 10A to 10G are sectional views showing a method of manufacturing a capacitor built-in interposer according to a third embodiment of the present invention.
Figure 10B:
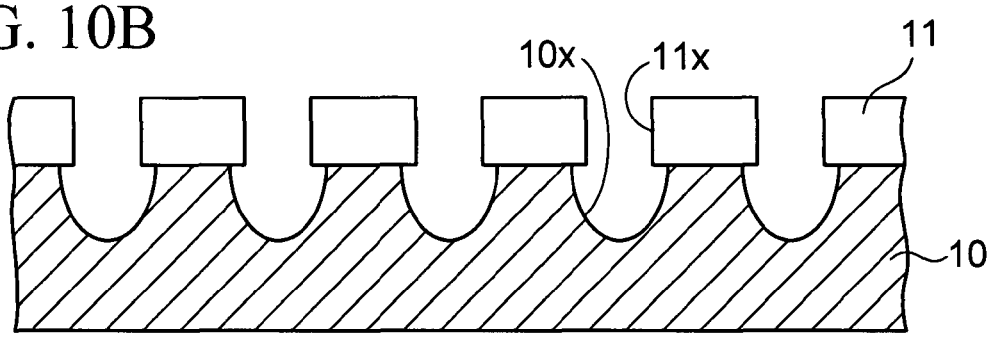
Figure 10C:
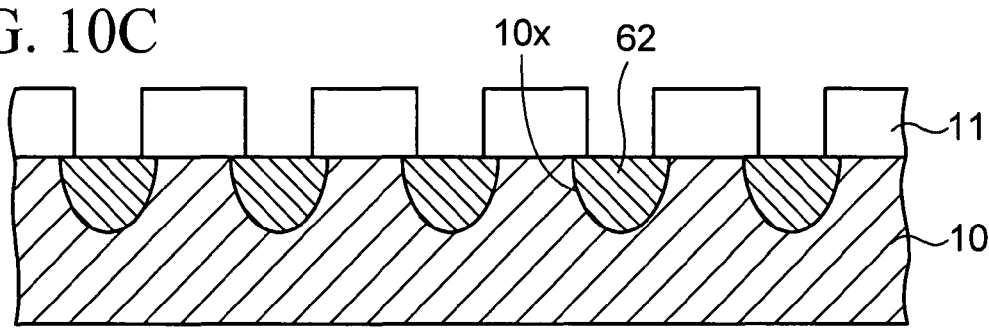

In the manufacturing method of the third embodiment, as shown in FIGS. 10A and 10B, the copper plate 10 as a metal supporting body is prepared, and a resist 11 having opening portions 11x is formed on the copper plate 10. Then, concave portions 10x are formed in the copper plate 10 by wet-etching the copper plate 10 through the opening portions 11x in the resist 11. Then, as shown in FIG. 10C, the solder layers 62 are formed in the concave portions 10x of the copper plate 10 by the electroplating utilizing the copper plate 10 as the plating power feeding path. Then, the resist 11 is removed.

Figure 10D:
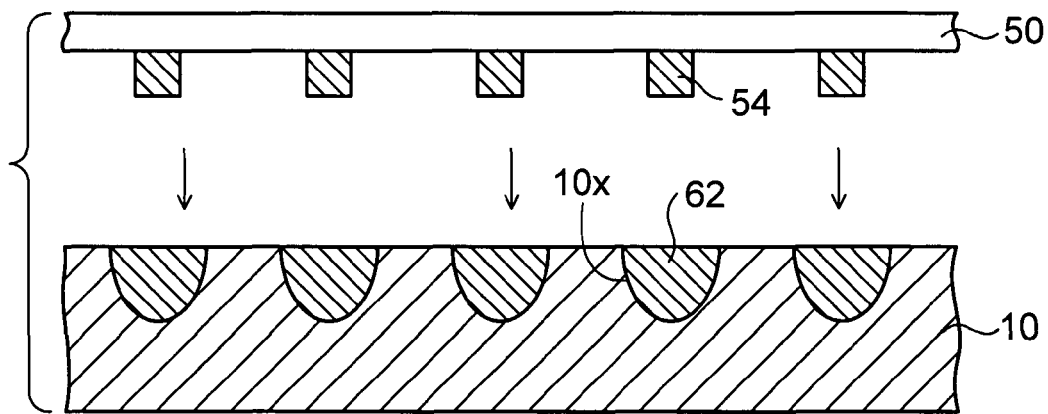
Figure 10E:
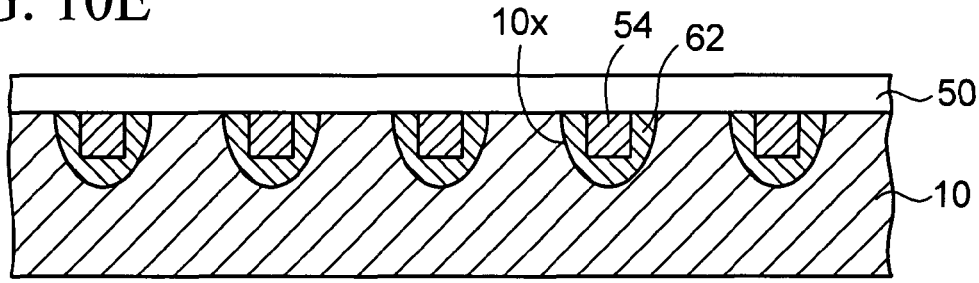

Then, as shown in FIG. 10D, like the second embodiment, the base resin layer 50 on which the copper posts 54 are provided to stand upright is prepared, and then the copper posts 54 are pushed into the solder layers 62 formed in the concave portions 10x of the copper plate 10. The solder layers 62 filled in the concave portions 10x of the copper plate 10 are arranged in the portions corresponding to the copper posts 54. Thus, as shown in FIG. 10E, the base resin layer 50 is pasted onto the copper plate 10 in a state that the copper posts 54 are buried in the solder layers 62 in the concave portions 10x of the copper plate 10.

Figure 10F:
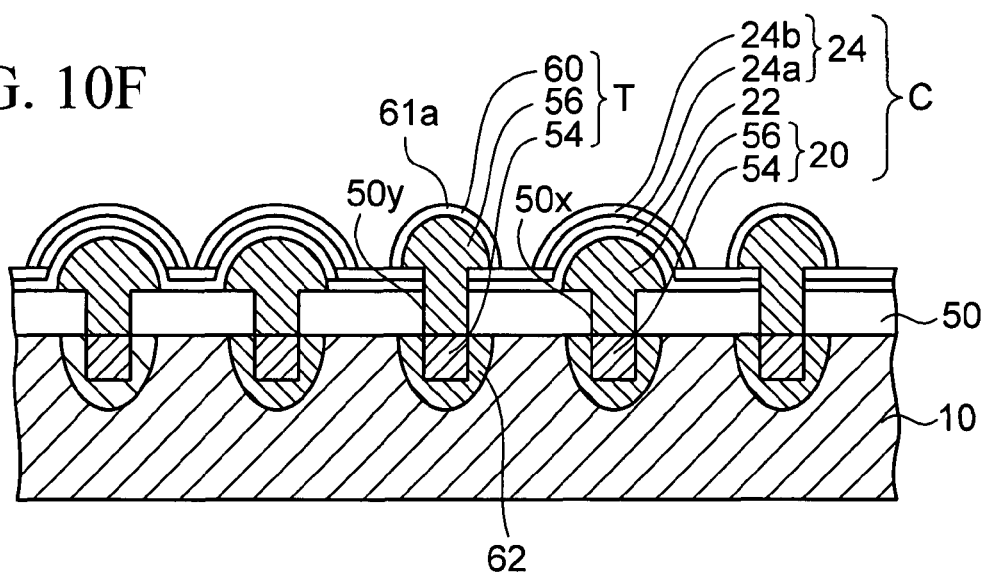

Then, as shown in FIG. 10F, the capacitors C and the through electrodes T are formed on the copper plate 10 by carrying out respective steps from the step in FIG. 6F to the step in FIG. 6M in the second embodiment.

Figure 10G:
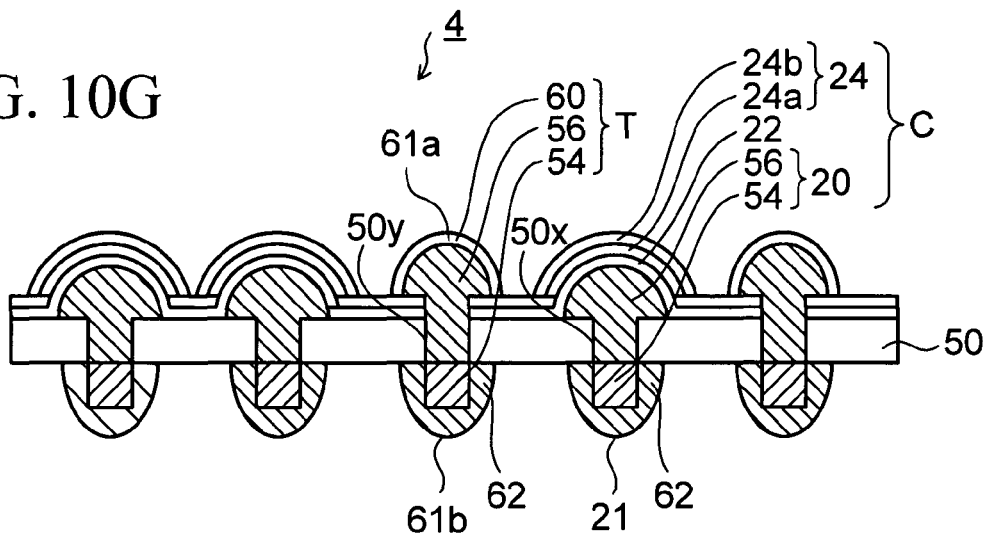

Then, as shown in FIG. 10G, the copper plate 10 is removed from the structural body in FIG. 10F by applying the etching selectively to the solder layers 62 and the base resin layer 50 by using an ammonia-based alkaline etchant. Thus, the solder layers 62 for coating the copper posts 54 are exposed, and the connection portions 21 of the first electrodes 20 of the capacitors C and the second connection portions 61b of the through electrodes T are obtained.

With the above, a capacitor built-in interposer 4 according to the third embodiment can be obtained. In the manufacturing method of the third embodiment, the solder layers 62 filled in the concave portions 10x of the copper plate 10 act as the solder layers 62 for covering the copper posts 54. Therefore, there is no need to coat the copper posts 54 by the solder layer 62 after the copper posts 54 are exposed. Also, since the step of forming the tin layer 12 and the step of removing the tin layer 12 are not needed unlike the second embodiment, this manufacturing method of the third embodiment is advantageous in cost.

The capacitor built-in interposer 4 of the third embodiment is applied as the interposer to connect the wiring substrate and the semiconductor chip like the second embodiment, and can achieve the advantages similar to those in the second embodiment.

What is claimed is:

1. A capacitor built-in interposer, comprising:
   a base resin layer having an opening portion which passes through to a thickness direction;
   a capacitor first electrode filled in a whole of the opening portion and having a first projection portion projected to a lower side from the opening portion and a second projection portion projected to an upper side from the opening portion,
   wherein the first projection portion serves as a connection portion and an end and a side of the first projection portion are exposed, and the second projection portion has a hemispherical shape;
   a capacitor dielectric layer covering a surface of the hemispherical shape of the second projection portion of the capacitor first electrode; and
   a capacitor second electrode covering the dielectric layer;
   wherein the capacitor is constructed by the first electrode, the dielectric layer, and the second electrode, and is arranged from the opening portion of the base resin layer onto the opening portion,
   and a plurality of capacitors are arranged in a lateral direction in a state that the capacitors are passed through the base resin layer, wherein an intermediate resin layer is formed between at least two of said plurality of capacitors.

2. A capacitor built-in interposer according to claim 1, further comprising:
a through electrode provided to pass through the base resin layer and having projection portions projected from both surface sides of the base resin layer respectively.

3. A capacitor built-in interposer according to claim 1, further comprising:
a resistor portion constructed by
a first electrode provided to pass through the base resin layer and having projection portions projected from both surface sides of the base resin layer respectively, whereby the projection portion on one surface side of the base resin layer serves as a connection portion;
an insulating layer for covering the first electrode on other surface side of the base resin layer; and
a second electrode for covering the insulating layer.

4. A capacitor built-in interposer according to claim 1, wherein the projection portion on a surface side of the base resin layer on which the second electrode is formed has a top end portion being shaped into a convex curved surface.

5. An electronic component device, comprising:
a wiring substrate having wiring layers;
the capacitor built-in interposer arranged on the wiring substrate and set forth in any one of claims 1 to 4, whereby the second electrode and one end side of the through electrode are connected electrically to the wiring layers of the wiring substrate; and
a semiconductor chip arranged on the capacitor built-in interposer, and connected electrically to the connection portion of the first electrode and other end side of the through electrode.

* * * * *